(12) United States Patent
Jeon et al.

(10) Patent No.: US 8,039,345 B2
(45) Date of Patent: Oct. 18, 2011

(54) METHODS OF FORMING SEMICONDUCTOR DEVICES

(75) Inventors: Kyung-yub Jeon, Yongin-si (KR);
Jong-heui Song, Suwon-si (KR);
Song-yi Yang, Seoul (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 0 days.

(21) Appl. No.: 12/816,642

(22) Filed: Jun. 16, 2010

(65) Prior Publication Data

US 2011/0059602 A1 Mar. 10, 2011

(30) Foreign Application Priority Data

Sep. 4, 2009 (KR) .................. 10-2009-0083513

(51) Int. Cl.
*H01L 21/336* (2006.01)
(52) U.S. Cl. ........ 438/261; 438/201; 438/257; 438/591; 257/E21.179; 257/E21.422; 257/E21.679
(58) Field of Classification Search .................. 438/195; 257/E21.179, E21.18, E21.613
See application file for complete search history.

(56) References Cited

U.S. PATENT DOCUMENTS

| 7,122,415 | B2 | 10/2006 | Jang et al. | |
| 2005/0287812 | A1* | 12/2005 | Wang et al. | ................... 438/710 |
| 2008/0085584 | A1* | 4/2008 | Noh et al. | ................... 438/264 |

FOREIGN PATENT DOCUMENTS

| KR | 1020050070708 | 7/2005 |
| KR | 1020080040214 | 5/2008 |

* cited by examiner

*Primary Examiner* — Cheung Lee
(74) *Attorney, Agent, or Firm* — Myers Bigel Sibley & Sajovec, P.A.

(57) ABSTRACT

A method of forming a semiconductor device may include forming a first pattern on a substrate, and forming a first dielectric layer on the first pattern. The first pattern may be between portions of the first dielectric layer and the substrate. A second dielectric layer may be formed on the first dielectric layer, and the first dielectric layer may be between the first pattern and the second dielectric layer. A second pattern may be formed on the second dielectric layer. Portions of the second dielectric layer may be exposed by the second pattern, and the first and second dielectric layers may be between portions of the first and second patterns. The exposed portions of the second dielectric layer may be isotropically etched.

18 Claims, 9 Drawing Sheets

METHODS OF FORMING SEMICONDUCTOR DEVICES

CROSS-REFERENCE TO RELATED APPLICATIONS

This application claims the benefit of Korean Patent Application No. 10-2009-0083513, filed on Sep. 4, 2009, in the Korean Intellectual Property Office, the disclosure of which is incorporated herein in its entirety by reference.

BACKGROUND

Embodiments of the present invention relate to methods of manufacturing semiconductor devices.

A NAND type non-volatile memory device is operated by storing charges in a floating gate and uses a blocking dielectric layer between a floating gate electrode and a control electrode. Methods of forming the blocking dielectric layer using a high-K material to increase capacitance of the blocking dielectric layers and improve leakage current characteristics thereof have been developed.

SUMMARY

According to some embodiments of the present invention, a method of forming a semiconductor device may include forming a first pattern on a substrate, and forming a first dielectric layer on the first pattern. The first pattern may be between portions of the first dielectric layer and the substrate. A second dielectric layer may be formed on the first dielectric layer, and the first dielectric layer may be between the first pattern and the second dielectric layer. A second pattern may be formed on the second dielectric layer. Portions of the second dielectric layer may be exposed by the second pattern, and the first and second dielectric layers may be between portions of the first and second patterns. The exposed portions of the second dielectric layer may be isotropically etched.

According to other embodiments of the present invention, a method of forming a semiconductor device may include forming a tunneling insulating layer pattern and a floating gate pattern on a substrate. The tunneling insulating layer pattern may be between the floating gate pattern and the substrate. First, second, and third dielectric sub-layers may be formed on the floating gate pattern, and the second dielectric sub-layer may include a high-k material between the first and third dielectric sub-layers. A conductive layer may be formed on the third dielectric sub-layer, and the first, second, and third dielectric sub-layers may be between the conductive layer and the floating gate pattern. The conductive layer may be patterned in a chamber to form a control gate pattern exposing portions of the third dielectric sub-layer. The exposed portions of the third dielectric sub-layer may be isotropically etched outside the chamber used to pattern the conductive layer.

According to still other embodiments of the present invention, a method of forming a semiconductor device may include forming a tunneling insulating layer on a substrate, and forming a first conductive layer on the tunneling insulating layer, wherein the tunneling insulating layer is between the first conductive layer and the substrate. The tunneling insulating layer and the first conductive layer may be patterned to provide a plurality of floating gate patterns on a respective plurality of tunneling insulating layer patterns. An insulating layer pattern may be formed on the substrate between adjacent floating gate patterns. A first silicon oxide layer may be formed on the insulating layer pattern, on sidewalls of the floating gate patterns, and on surfaces of the floating gate patterns opposite the substrate. A high-k dielectric layer may be formed on the first silicon oxide layer wherein the first silicon oxide layer is between the high-k dielectric layer and the floating gate patterns. A second silicon oxide layer may be formed on the high-k dielectric layer wherein the high-k dielectric layer is between the first and second silicon oxide layers. A second conductive layer may be formed on the second silicon oxide layer wherein the second silicon oxide layer is between the second conductive layer and the floating gate patterns. A mask pattern may be formed on the second conductive layer exposing portions of the second conductive layer. The exposed portions of the second conductive layer may be anisotropically etched using the mask pattern to provide a control gate pattern exposing portions of the second silicon oxide layer. The exposed portions of the second silicon oxide layer may be isotropically etched using remote plasma.

Embodiments of the present invention may provide a method of manufacturing a semiconductor device in which a high-K material may be removed at a high etching rate without damaging adjacent layers around the high-K material.

According to some embodiments of the present invention, a method of manufacturing a semiconductor device may include forming a lower pattern on a substrate, and forming at least one dielectric layer on the lower pattern. An upper dielectric layer may be formed on the at least one dielectric layer, and an upper pattern may be formed on the upper dielectric layer. The upper pattern may expose a portion of the upper dielectric layer. The exposed portion of the upper dielectric layer may be isotropically etched.

Isotropically etching the exposed portion of the upper dielectric layer may be performed in a chamber different from a chamber used to form the upper pattern.

Forming the lower pattern may include sequentially forming a tunneling insulating layer and a first conductive layer on the substrate, and forming a tunneling insulating layer pattern and a floating gate pattern by respectively patterning the tunneling insulating layer and the first conductive layer. Forming the upper pattern may include forming a second conductive layer on the upper dielectric layer, and forming a control gate pattern by patterning the second conductive layer.

Forming the at least one dielectric layer may include forming a lower dielectric layer on sidewalls and an upper surface of the lower pattern, and forming a high-K layer between the lower dielectric layer and the upper dielectric layer.

The high-K layer may comprise a stack including at least one selected from the group consisting of aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide (LaAlO), lanthanum hafnium oxide (LaHfO), hafnium aluminum oxide (HfAlO), and/or praseodymium oxide ($Pr_2O_3$).

The method may further include isotropically etching a portion of the high-K layer in the same chamber as a chamber used to isotropically etch the portion of the upper dielectric layer.

The method may further include anisotropically etching a portion of the high-K layer in a chamber different from a chamber used to isotropically etch the portion of the upper dielectric layer.

Isotropically etching the exposed portion of the upper dielectric layer may be performed using remote plasma. A plasma bias power applied when using the remote plasma may be in the range of about 0 W to about 100 W. Isotropically etching the exposed portion of the upper dielectric layer may be performed using a wet etching method.

According to other embodiments of the present invention, a method of manufacturing a semiconductor device may include forming a tunneling insulating layer pattern on a substrate, and forming a floating gate pattern on the tunneling insulating pattern. A lower dielectric layer, a high-K layer, and an upper dielectric layer may be formed on the floating gate pattern, and a conductive layer may be formed on the upper dielectric layer. A control gate pattern may be formed by etching the conductive layer such that a portion of the upper dielectric layer is exposed, and the exposed portion of the upper dielectric layer may be isotropically etched, in a chamber different from a chamber used to etch the conductive layer.

The method may further include etching a portion of the high-K layer. Etching the portion of the high-K layer may include isotropically etching the portion of the high-K layer in the same chamber used to isotropically etch the exposed portion of the upper dielectric layer. Etching the portion of the high-K layer may include anisotropically etching the portion of the high-K layer in a chamber different from the chamber used to isotropically etch the exposed portion of the upper dielectric layer.

The method may further include, after isotropically etching the exposed portion of the upper dielectric layer, etching a portion of the lower dielectric layer, and etching a portion of the floating gate pattern. The upper dielectric layer may include a silicon oxide layer. Isotropically etching a portion of the silicon oxide layer may include isotropically etching the portion of the silicon oxide layer using remote plasma in a chamber different from the chamber used to etch the conductive layer.

According to other embodiments of the present invention, a method of manufacturing a semiconductor device may include sequentially forming a tunneling insulating layer and a first conductive layer on a substrate. A plurality of tunneling insulating layer patterns and a plurality of floating gate patterns may be formed by respectively patterning the tunneling insulating layer and the first conductive layer. An insulating layer pattern may be formed between any two of the floating gate patterns. A lower silicon oxide layer, a high-K layer, and an upper silicon oxide layer may be sequentially formed on an upper surface and side surfaces of the plurality of the floating gate patterns and an upper surface of the plurality of the insulating layer patterns. A second conductive layer may be formed on the upper silicon oxide layer. A hard mask pattern and a photoresist pattern may be sequentially formed on the second conductive layer. A control gate pattern may be formed by anisotropically etching the second conductive layer by using the hard mask pattern and the photoresist pattern as a mask such that a portion of the upper silicon oxide layer is exposed. The exposed portion of the upper silicon oxide layer may be isotropically etched in a chamber that uses remote plasma.

After isotropically etching the exposed portion of the upper silicon oxide layer, the photoresist pattern may be ashed, and the hard mask pattern may be stripped.

Isotropically etching the exposed portion of the upper silicon oxide layer, ashing the photoresist pattern, and stripping the hard mask pattern may be performed in the same chamber that uses the remote plasma.

BRIEF DESCRIPTION OF THE DRAWINGS

Embodiments of the present invention will be more clearly understood from the following detailed description taken in conjunction with the accompanying drawings in which.

DETAILED DESCRIPTION OF THE EMBODIMENTS

Figure 1:
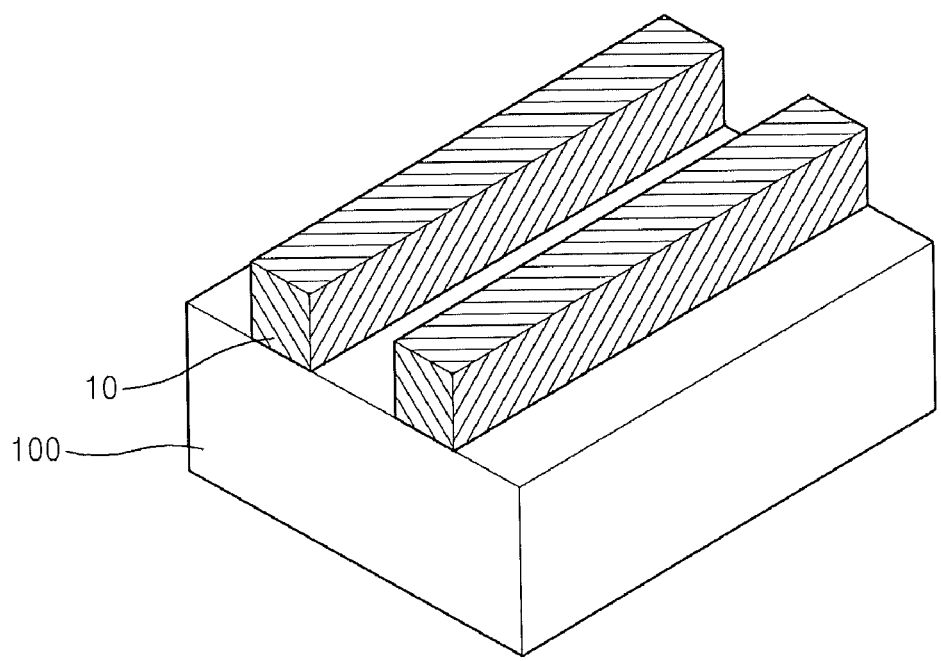
FIGS. 1 through 6 are perspective views illustrating methods of manufacturing a semiconductor device according to some embodiments of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element is referred to as being "connected to" or "coupled to" another element, it can be connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, etc. may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In addition, when terms used in this specification are not specifically defined, all the terms used in this specification (including technical and scientific terms) can be understood by those skilled in the art. Further, when general terms defined in the dictionaries are not specifically defined, the terms will have the normal meaning in the art.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings, the illustrated features may be changed due to, for example, the manufacturing technology and/or tolerance. Accordingly, it should be understood that the example embodiments of the inventive concept are not limited to the drawings but include modifications of the features of elements caused due to, for example, the manufacture.

FIGS. 1 through 6 are perspective views illustrating methods of manufacturing a semiconductor device according to some embodiments of the present invention.

Referring to FIG. 1, a lower pattern 10 is formed on a substrate 100. The lower pattern 10 may include a conductive material. The lower pattern 10 may be linear and repeatedly arranged on the substrate 100. The lower pattern 10 may directly contact a surface of the substrate 100 or a thin film (not shown) that is formed on the surface of the substrate 100 may be between the surface of the substrate 100 and the lower pattern 10.

Figure 2:
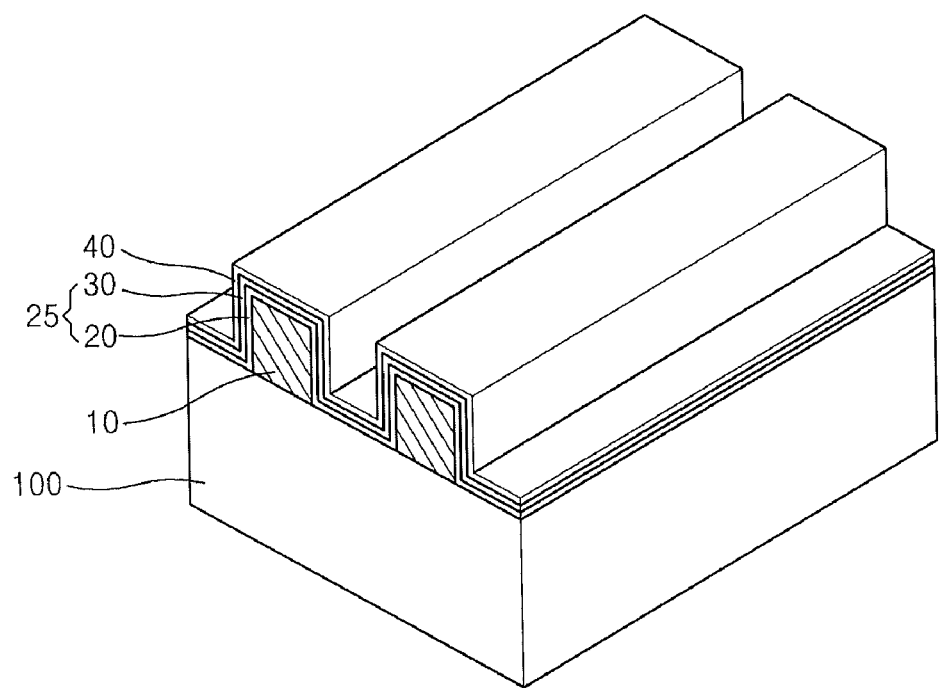

Referring to FIG. 2, at least one dielectric layer 25 is formed on sidewalls and an upper surface of the lower pattern 10 and on an upper surface of the substrate 100. The at least one dielectric layer 25 may include a lower dielectric layer 20 and a high-K layer 30. The lower dielectric layer 20 may be a silicon oxide layer. The high-K layer 30 may include a metal oxide layer having higher permittivity and/or dielectric constant than a silicon nitride. The metal oxide layer may be a stack including at least one selected from the group consisting of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide (LaAlO), lanthanum hafnium oxide (LaHfO), hafnium aluminum oxide (HfAlO), and/or praseodymium oxide ($Pr_2O_3$). For example, the metal oxide layer may include at least a first layer of a first one of the above referenced materials and a second layer of a second one of the above referenced materials. An upper dielectric layer 40 is formed on the at least one dielectric layer 25. The upper dielectric layer 40 may be a silicon oxide layer.

When the lower and upper dielectric layers 20 and 40 are formed as silicon oxide layers, they may be formed of the same material and have the same inner structure. However, the lower and upper dielectric layers 20 and 40 may instead be formed of a single layer including at least one selected from the group consisting of $SiO_2$, carbon-doped $SiO_2$, fluorine-doped $SiO_2$, and/or porous $SiO_2$. Also, the silicon oxide layers may be formed of a high temperature oxide (HTO) that is formed by high temperature oxidation using a $SiH_2Cl_2$—$H_2O$ gas, which has appropriate internal pressure and time dependent dielectric breakdown (TDDB) characteristics, as a source gas, but are not limited thereto.

Figure 3:
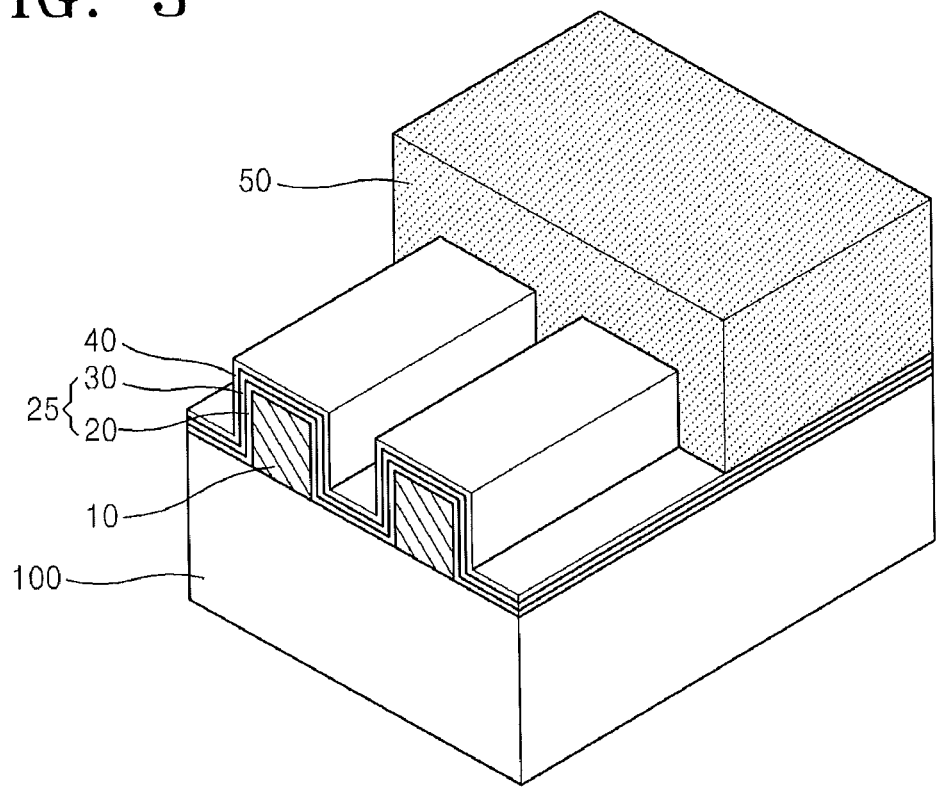

Referring to FIG. 3, an upper pattern 50 is formed on the upper dielectric layer 40. The upper pattern 50 may have a linear pattern that extends in a direction perpendicular with respect to a direction of the lower pattern 10. The upper pattern 50 may include one or more selected from the group consisting of impurity-doped polysilicon, a metal, a metal silicide, and/or a combination thereof. The upper pattern 50 has a shape that selectively covers portions of the upper dielectric layer 40, exposing a portion of the upper dielectric layer 40.

Figure 4:
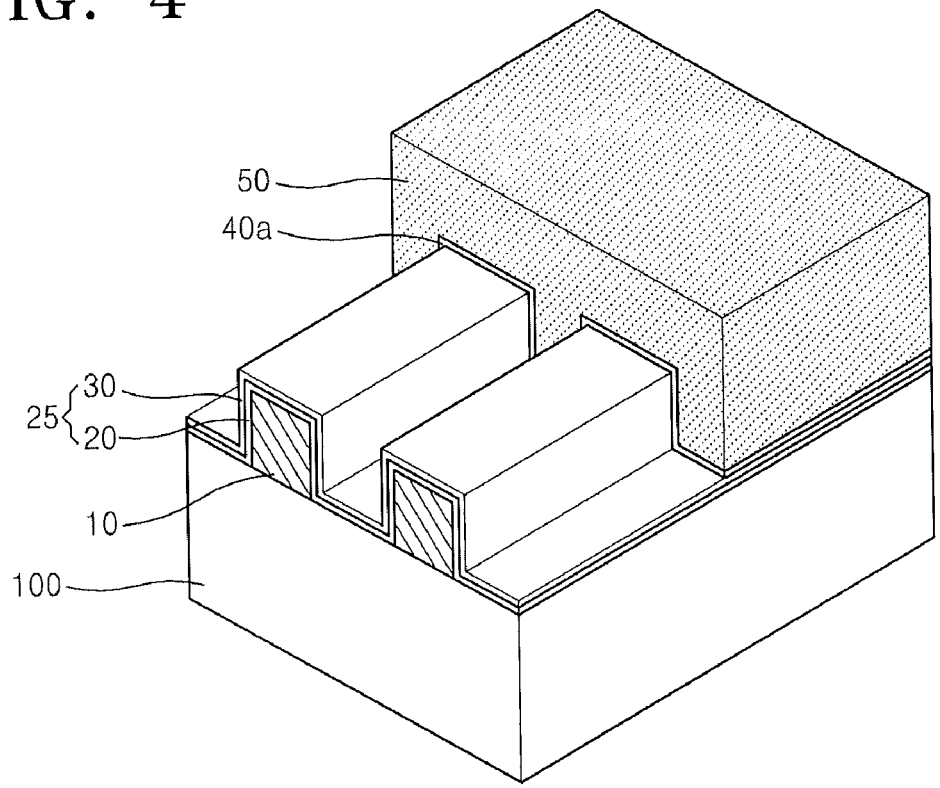

Referring to FIG. 4, the exposed portion of the upper dielectric layer 40 of FIG. 3 is isotropically etched. The isotropic etching may be performed according to a wet etching method. Also, the isotropic etching may be performed according to a dry etching method using remote plasma. More particularly, a plasma bias power applied when using remote plasma may be maintained very low, for example, in the range of about 0 W to about 100 W, so that the exposed portion of the upper dielectric layer 40 of FIG. 3 may be isotropically dry-etched. Due to ion bombardment with the low plasma bias power, the exposed upper surface and sidewalls of the upper dielectric layer 40 of FIG. 3 may be uniformly etched. When the exposed portion of the upper dielectric layer 40 of FIG. 3 is isotropically etched, only an upper dielectric layer 40a remains between the upper pattern 50 and the high-K layer 30. The isotropic etching of the exposed portion of the upper dielectric layer 40 may be performed in a chamber different from a chamber used to form the upper pattern 40 of FIG. 3.

Figure 5:
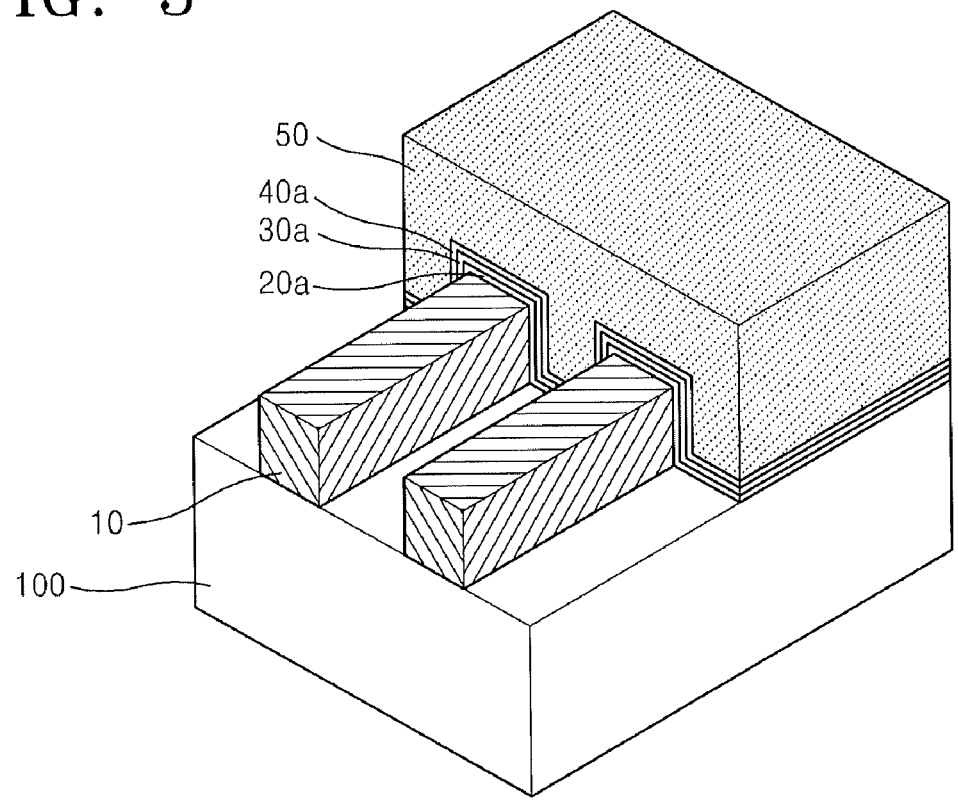

Referring to FIG. 5, a portion of the at least one dielectric layer 25 exposed by etching the exposed portion of the upper dielectric layer 40 of FIG. 3 is etched. Since the upper dielectric layer 40 of FIG. 3 may be uniformly etched by isotropic etching, the upper oxide layer 40 does not remain as a spacer on the sidewalls of the high-K layer 30. Accordingly, an etch rate of the high-K layer 30 of FIG. 4 may be increased. The high-K layer 30 of FIG. 4 may be isotropically etched in the same chamber as the chamber used in etching the exposed portion of the upper dielectric layer 40 of FIG. 3 or anisotropically etched in a chamber different from the chamber used in etching the exposed portion of the upper dielectric layer 40. Next, a portion of the lower oxide layer 20 of FIG. 4 exposed by etching the exposed portion of the high-K layer 30 of FIG. 4 is etched. When an exposed portion of at least one of dielectric layer 20 or 30 of FIG. 4 is etched, at least one of dielectric layer 20a and 30a remains only between the upper pattern 50 and the lower pattern 10.

Figure 6:
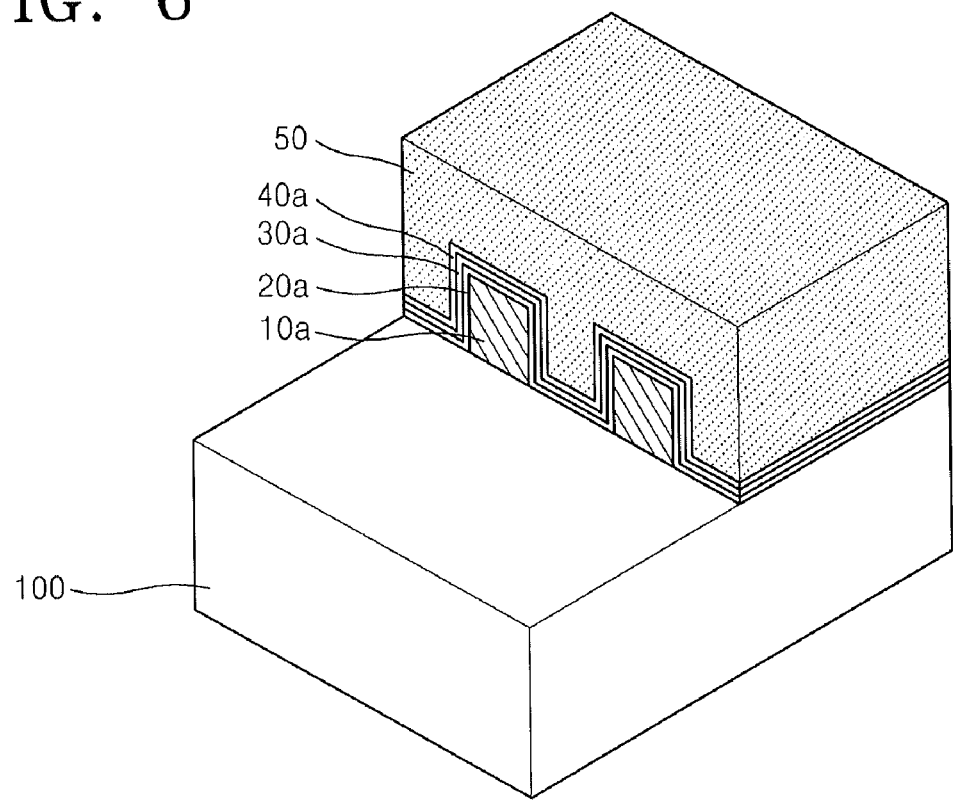

Referring to FIG. 6, an exposed portion of the lower pattern 10 of FIG. 5 is removed. Accordingly, a lower pattern 10a remains only between the substrate 100 and the at least one of the dielectric layers 20a and 30a.

Although not illustrated in the drawings, the lower pattern 10a may include a tunneling insulating layer pattern (not shown) and a floating gate pattern (not shown), and the upper pattern 50 may include a control gate pattern (not shown). The tunneling insulating layer pattern and the floating gate pattern may be formed by sequentially forming a tunneling insulating layer (not shown) and a first conductive layer (not shown) and patterning the same. The control gate pattern may be formed by forming a second conductive layer (not shown) on the upper dielectric layer 40 and patterning the same. This will be described in greater detail below with reference to FIGS. 7 through 15.

FIGS. 7 through 15 are perspective views illustrating methods of manufacturing a semiconductor device according to other embodiments of the present invention.

Figure 7:
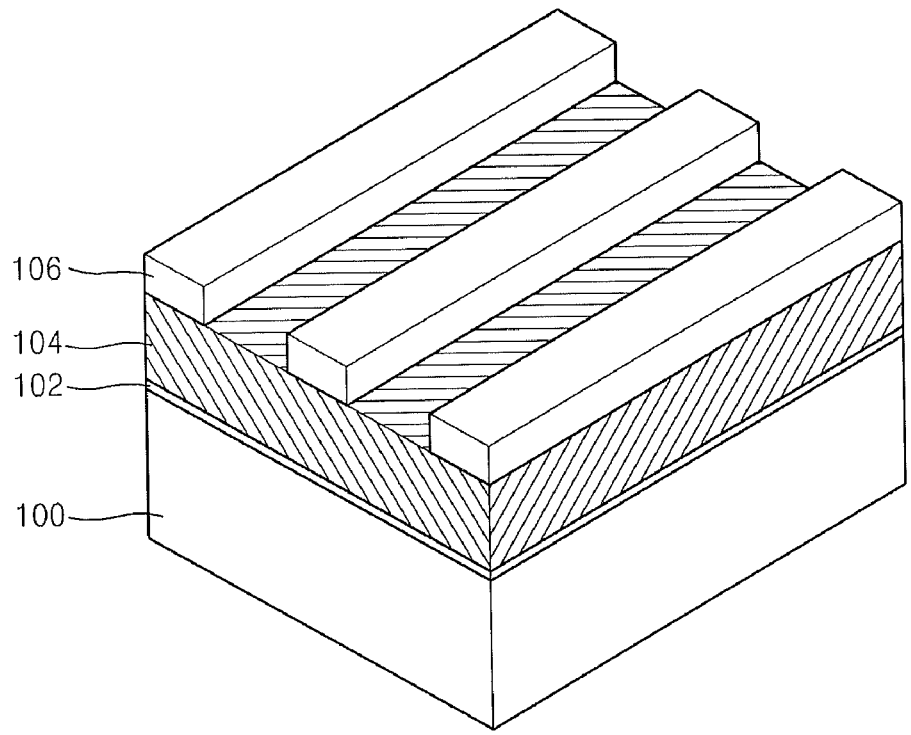
FIGS. 7 through 15 are perspective views illustrating methods of manufacturing a semiconductor device according to other embodiments of the present invention.

Referring to FIG. 7, a tunneling insulating layer 102 is formed on a substrate 100. The substrate 100 may be a semiconductor substrate, and may include at least one selected from the group consisting of silicon-on-insulator, silicon-on-sapphire, germanium, silicon-germanium, and/or gallium-arsenide. The tunneling insulating layer 102 may be a stack including at least one of the group consisting of silicon oxide ($SiO_2$), silicon nitride ($Si_3N_4$), silicon oxide nitride (SiON), hafnium oxide ($HfO_2$), hafnium silicon oxide ($HfSi_xO_y$), aluminum oxide ($Al_2O_3$), and/or zirconium oxide ($ZrO_2$). For example, the tunneling insulating layer 102 may include at least a first layer of a first one of the above referenced materials and a second layer of a second one of the above referenced materials.

Then, a first conductive layer 104 (to provide a floating gate pattern) is formed on the tunneling insulating layer 102. The first conductive layer 104 may include polysilicon that is doped with impurities. In greater detail, the polysilicon may be deposited on the tunneling insulating layer 102 using chemical vapor deposition (CVD) (for example, a low pressure chemical vapor deposition (LPCVD) method that uses $SiH_4$ gas or $Si_2H_6$—$PH_3$ gas), and then an impurity doping process may be performed, thereby forming the first conductive layer 104.

A first hard mask layer (not shown) is formed on the first conductive layer 104. The first hard mask layer may be formed of a material that has an etching selectivity with respect to the first conductive layer 104, the tunneling insulating layer 102, and the substrate 100. For example, the first hard mask layer may include silicon nitride and/or silicon oxide nitride.

The first hard mask layer is coated with a first photoresist layer (not shown), and then the first photoresist layer is exposed and developed to form a first photoresist pattern (not shown) on the first hard mask layer. The first photoresist pattern may selectively cover a portion corresponding to an active area of the substrate 100. In greater detail, the first photoresist pattern may be linear, extending in a first direction, and may be formed repeatedly.

Next, the first hard mask layer is etched using the first photoresist pattern as an etching mask to form a first hard mask pattern 106. The first photoresist pattern may be removed using an ashing process and/or a stripping process.

Figure 8:
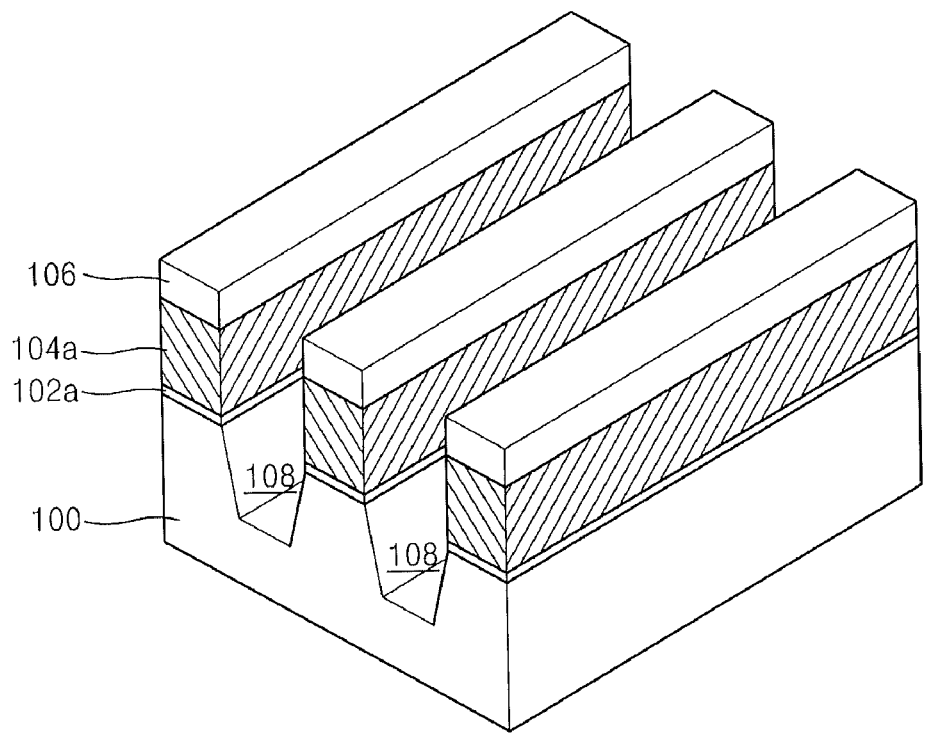

Referring to FIG. 8, the first conductive layer 104 and the tunneling insulating layer 102 are patterned to form a floating gate pattern 104a and a tunneling insulating layer pattern 102a on the substrate 100. By using the first hard mask pattern 106 as an etching mask, the first conductive layer 104 and the tunneling insulating layer 102 are sequentially etched. Next, a portion of the substrate 100 that is exposed between the floating gate pattern 104a is etched to form a trench 108 in the substrate 100.

Figure 9:
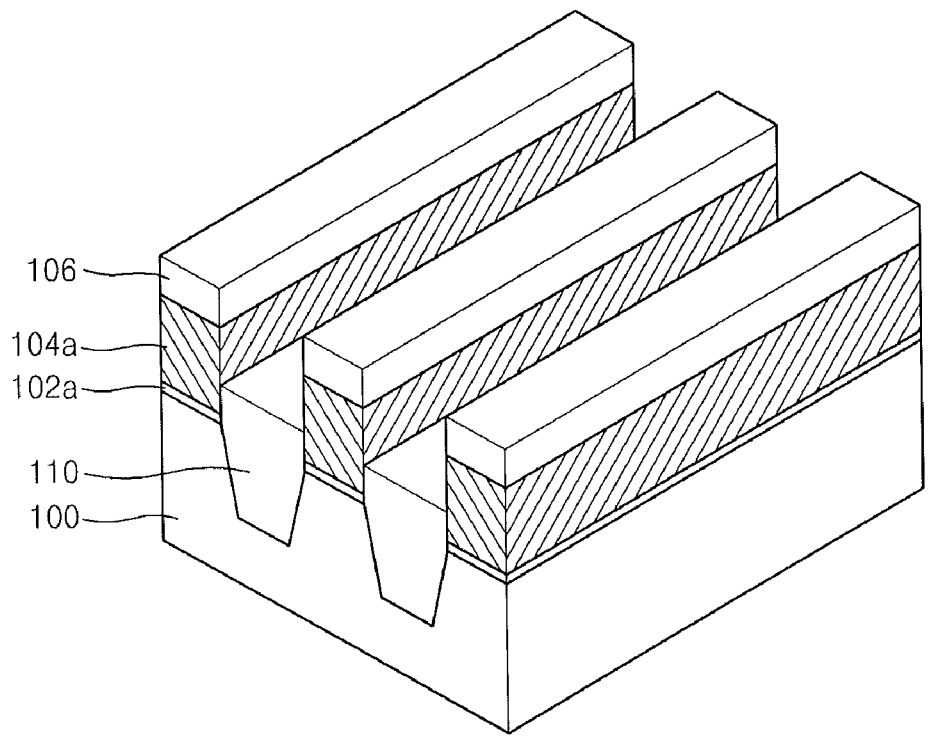

Referring to FIG. 9, an insulating layer (not shown) is formed in the trench 108 to completely fill the trench 108, and the insulating layer is planarized to form a preliminary insulating layer pattern (not shown). The planarization may be performed using a chemical mechanical polishing (CMP) process, an etch back process, or a combination of CMP and etch back processes. The insulating layer may be formed by depositing an oxide having excellent gap fill characteristics to completely fill the trench 108, which has a small width, using CVD. For example, the insulating layer may be an oxide that is formed using a high density plasma CVD (HDP-CVD) method.

Next, an insulating layer pattern 110 having a smaller thickness than the preliminary insulating layer pattern is formed by anisotropically etching the preliminary insulating layer pattern. A top surface of the insulating layer pattern 110 may be lower than an upper surface of the floating gate pattern 104a and higher than a lower surface of the floating gate pattern 104a. In greater detail, the top surface of the insulating layer pattern 110 may be lower than a mid-portion of the height of the floating gate pattern 104a and higher than the lower surface of the floating gate pattern 104a. Accordingly, a portion of the insulating layer 110 may protrude at the sides of the floating gate pattern 104a. Next, the first hard mask pattern 106 is removed, exposing the upper surface of the floating gate pattern 104a.

Figure 10:
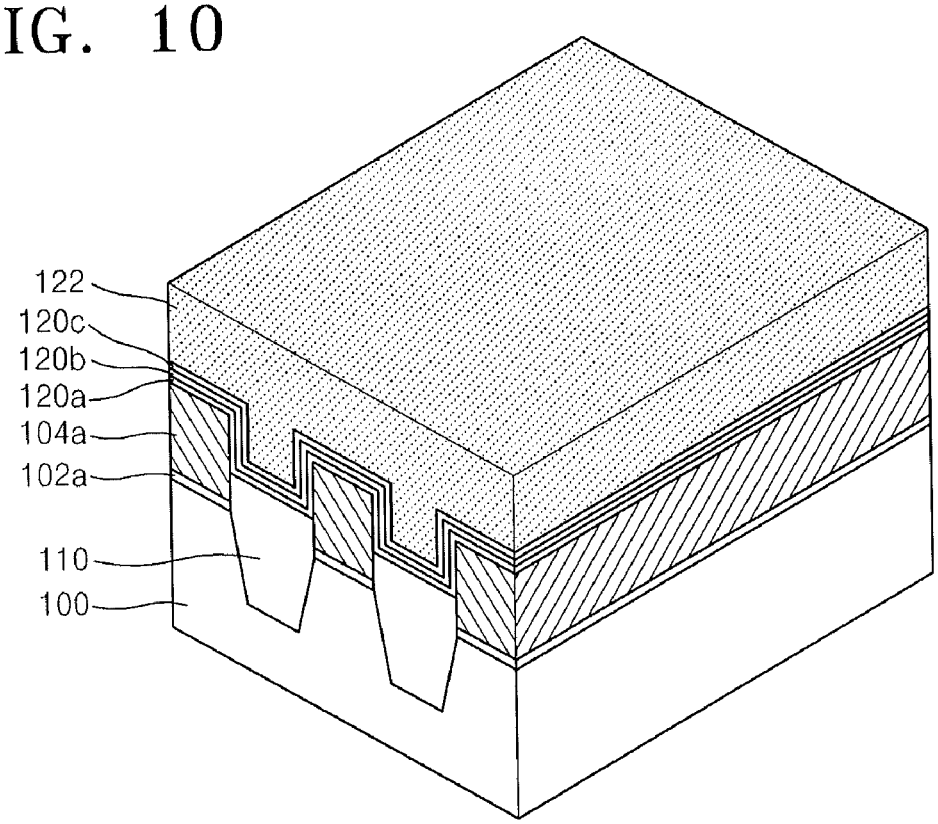

Referring to FIG. 10, a lower dielectric layer 120a, a high-K layer 120b, and an upper dielectric layer 120c are sequentially formed on surfaces of the insulating layer pattern 110 and the floating gate pattern 104a. The lower dielectric layer 120a, the high-K layer 120b, and the upper dielectric layer 120c may include materials that are used to form a blocking dielectric layer.

For example, the lower dielectric layer 120a and the upper dielectric layer 120c may each include a silicon oxide layer. When the lower dielectric layer 120a and the upper dielectric layer 120c are formed as silicon oxide layers, they may be formed of the same material and have a same inner structure. However, the lower and upper dielectric layers 20 and 40 may each instead be formed of a single layer including at least one selected from the group consisting of $SiO_2$, carbon-doped $SiO_2$, fluorine-doped $SiO_2$, and/or porous $SiO_2$. Also, the silicon oxide layers may be formed of a high temperature oxide (HTO) that is formed using high temperature oxidation using a $SiH_2Cl_2$—$H_2O$ gas, which has appropriate internal pressure and time dependent dielectric breakdown (TDDB) characteristics, as a source gas, but are not limited thereto.

The high-K layer 120b may include a metal oxide layer having higher permittivity and/or dielectric constant than a silicon oxide layer and a silicon nitride layer. The metal oxide layer may be a stack including at least one selected from the group consisting of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide (LaAlO), lanthanum hafnium oxide (LaHfO), hafnium aluminum oxide (HfAlO), and/or praseodymium oxide ($Pr_2O_3$).

Next, a second conductive layer 122 (to be a control gate pattern) is formed on the upper dielectric layer 120c. The second conductive layer 122 may include at least one selected from the group consisting of an impurity-doped polysilicon, a metal, and/or a metal silicide. In greater detail, the second conductive layer 122 may be a stack including at least one selected from the group consisting of polysilicon, aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr), a nitride of these, and/or a silicide and/or a combination of these. However, the layer structures and materials of the second conductive layer 122 are provided by way of example and are not limited thereto.

Figure 11:
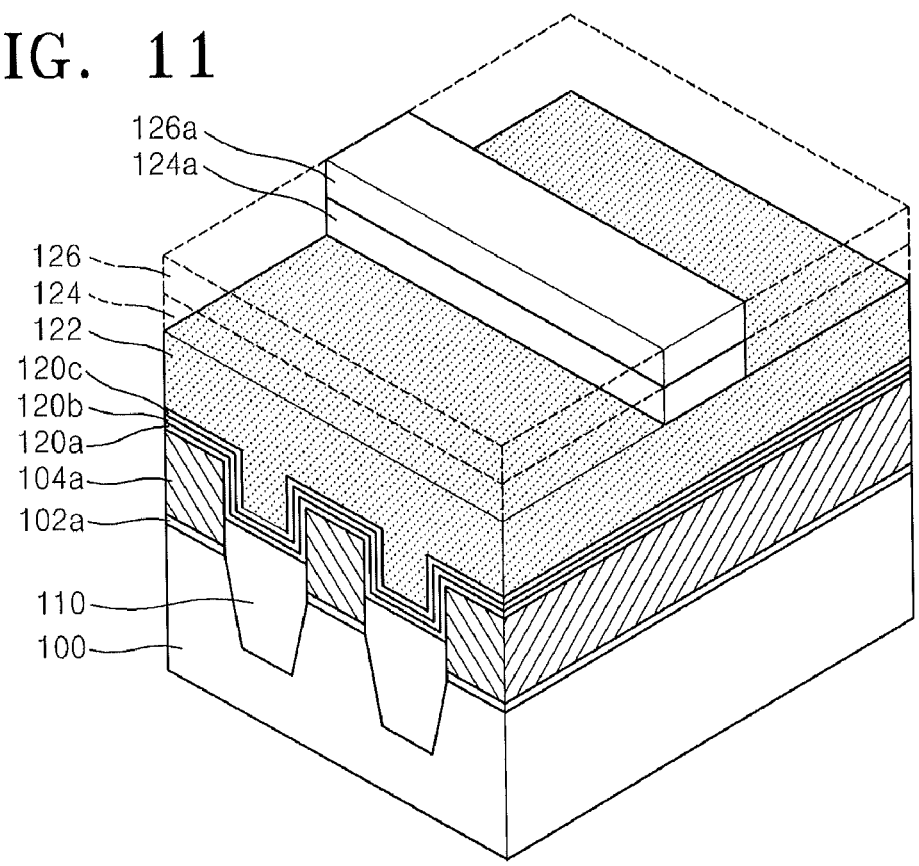

Referring to FIG. 11, a second hard mask layer 124 is formed on the second conductive layer 122. The second hard mask layer 124 may be a material having etching selectivity with respect to the material of the second conductive layer 122. For example, the second hard mask layer 124 may include silicon oxide, silicon nitride, and/or silicon oxide nitride.

The second hard mask layer 124 is coated with a second photoresist layer 126, and the second photoresist layer 126 is exposed and developed to form a second photoresist pattern 126a on the second hard mask layer 124. The second photoresist pattern 126a selectively covers portions of the second hard mask layer 124. In greater detail, the second photoresist pattern 126a may be linear, extending in a direction perpendicular with respect to a direction of the floating gate pattern 104a. The second photoresist pattern 126a may have a repeated pattern. Stated in other words, the second photoresist pattern 126a may include a plurality of linear and parallel patterns. Next, the second photoresist pattern 126a is used as an etching mask to etch the second hard mask layer 124 to form a second hard mask pattern 124a.

Figure 12:
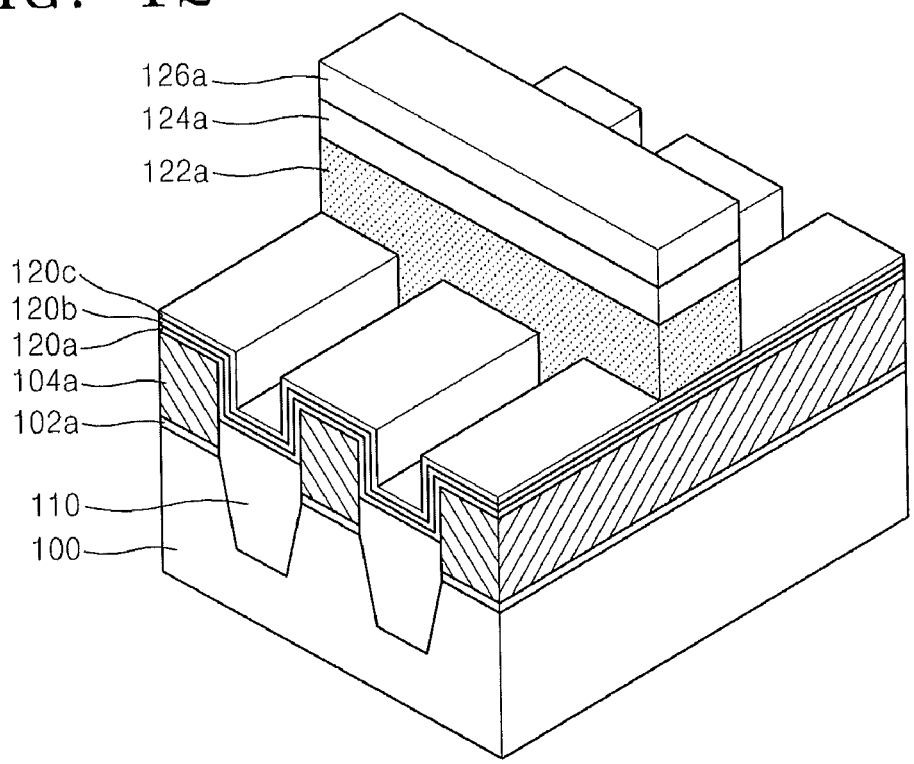

Referring to FIG. 12, the second hard mask pattern 124a and the second photoresist pattern 126a are used as an etching mask to etch the second conductive layer 122 of FIG. 11. By etching the second conductive layer 122 of FIG. 11, a control gate pattern 122a is formed, and a portion of the upper dielectric layer 120c is exposed. The second conductive layer 122 of FIG. 11 may be anisotropically etched using a gas that is formed by combining $CF_4$, $O_2$, HBr, and He.

Figure 13:
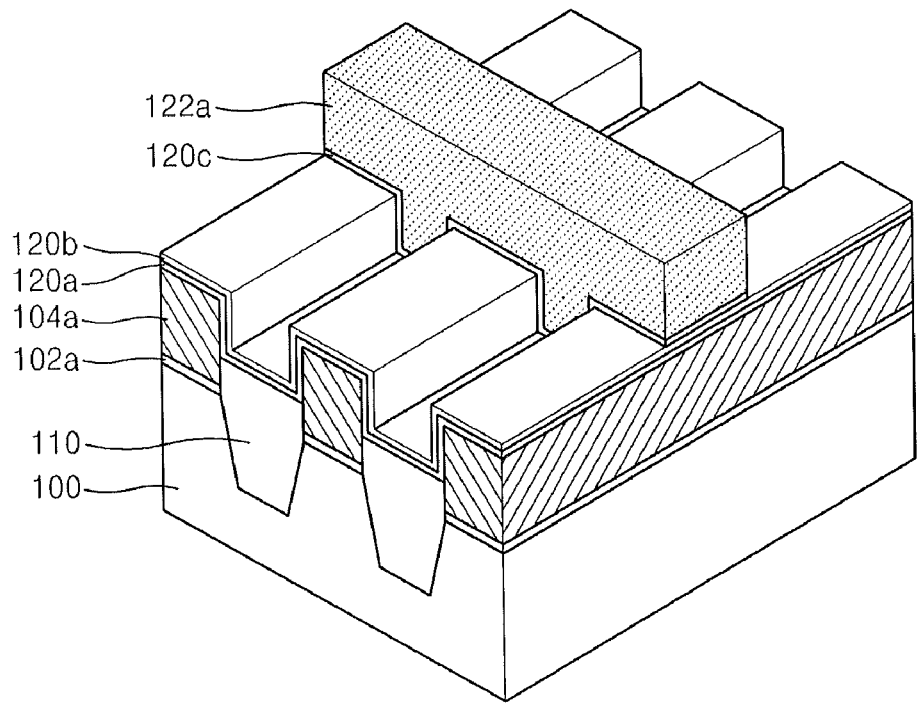

Referring to FIG. 13, the second photoresist pattern 126a and the second hard mask pattern 124a are removed using an ashing process and/or a strip process, and the exposed portion of the upper dielectric layer 120c of FIG. 12 is isotropically etched. For the isotropic etching, remote plasma may be used, and a plasma bias power applied when using the remote plasma may be adjusted to be low, thereby performing the isotropic etching by inducing ion bombarding. Accordingly, the upper surface and sidewalls of the upper dielectric layer 120c of FIG. 12 may be uniformly etched. If the second conductive layer 122 of FIG. 11 is anisotropically etched, the etching of an exposed portion of the upper dielectric layer 120c may be performed in a chamber different from a chamber used in etching the second conductive layer 122 of FIG. 11 so that exposed portions of the upper dielectric layer 120c may be isotropically etched. As the exposed portion of the upper dielectric layer 120c is etched, a portion of the high-K layer 120b is exposed.

When the upper dielectric layer 120c of FIG. 12 is a silicon oxide layer, the silicon oxide layer may first be removed by isotropic etching, to reduce and/or prevent any residual silicon oxide layer, particularly, a silicon oxide layer, having the form of a spacer formed on the sidewalls of the floating gate pattern from remaining. Accordingly, an etching process may be performed on both the upper surface and sides of the exposed portion of the high-K layer 120b, and thus the etch rate may be significantly increased. Furthermore, as the etch rate increases, side pitting caused by damage to boundary portions of the substrate 100 due to excessive etching of the insulating layer pattern 110 may be reduced and/or prevented.

Also, the exposed portion of the high-K layer 120b may be etched at a relatively high etch rate, and thus a difference between the degree the exposed portion of the high-K layer 120b is removed and the degree other exposed portions of other layers near the exposed portion of the high-K layer 120b are removed due to a difference in densities of patterns, that is, a loading difference, may be reduced.

When the upper dielectric layer 120c of FIG. 12 is anisotropically etched, the sidewalls of the upper dielectric layer 120c may not be easily etched compared to the upper surface of the upper dielectric layer 120c. Accordingly, a fence may be formed from the sidewalls of the upper dielectric layer 120c that are not etched. Due to the fence, the high-K layer 120b and the lower dielectric layer 120a of FIG. 12 may also be more slowly etched, and the sidewalls of the floating gate pattern 104a of FIG. 12 may not be completely etched. Thus, the floating gate pattern 104a of FIG. 12 may not be completely etched, and a portion of the sidewalls thereof may remain, thereby causing a stringer defect where a short circuit may be generated between strings. However, according to methods of current embodiments of the present invention, the upper dielectric layer 120c of FIG. 12 may be isotropically etched, and thus the upper surface and the sidewalls of the exposed upper dielectric layer 120c of the FIG. 12 may be relatively uniformly removed. Accordingly, formation of fence and stringer defects caused by the fence may be reduced and/or prevented.

The source gas injected into the remote plasma may include, for example, oxygen and fluorine-based gas. In detail, the fluorine-based gas may include fluorocarbon-based gas such as $CF_4$, $C_2F_6$, $C_3F_8$, $CH_2F_2$, or $C_4F_8$, or $NF_3$, $SF_6$, or the like.

An ashing process and/or a strip process to remove the second photoresist pattern 126a of FIG. 12 and the second hard mask pattern 124a of FIG. 12 may be simultaneously performed in a chamber in which the upper dielectric layer 120c of FIG. 12 is isotropically etched. Accordingly, the second photoresist pattern 126a of FIG. 12, the second hard mask pattern 124a of FIG. 12, and the exposed portion of the upper dielectric layer 120c of FIG. 12 may be removed at the same time by using the remote plasma without performing an ashing process and/or a strip process.

Figure 14:
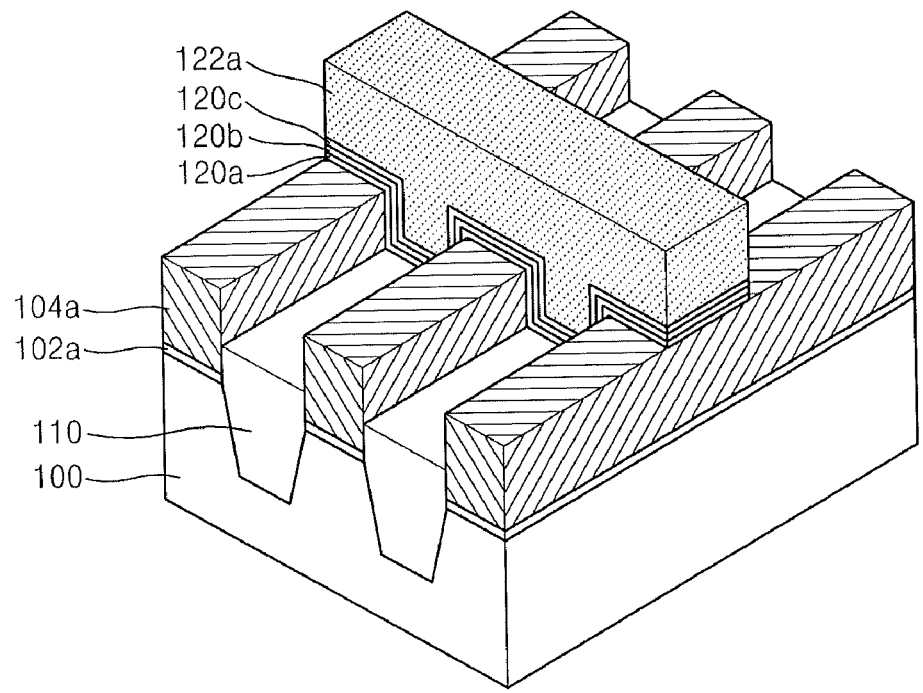

Referring to FIG. 14, a portion of the high-K layer 120b of FIG. 13 and a portion of the lower dielectric layer 120a of FIG. 13 may be etched. The portions of the high-K layer 120b and the lower dielectric layer 120a of FIG. 13 may be isotropically etched in the same chamber as the upper dielectric layer 120c of FIG. 12. The portion of the high-K layer 120b of FIG. 13 and the portion of the lower dielectric layer 120a of FIG. 13 may be anisotropically etched in another chamber different than that used to etch the upper dielectric layer 120c of FIG. 12. The anisotropic etching may be performed using $Cl_2$, $BCl_3$, HBr, $O_2$, and/or He, or a combination(s) thereof, as an etching gas.

Figure 15:
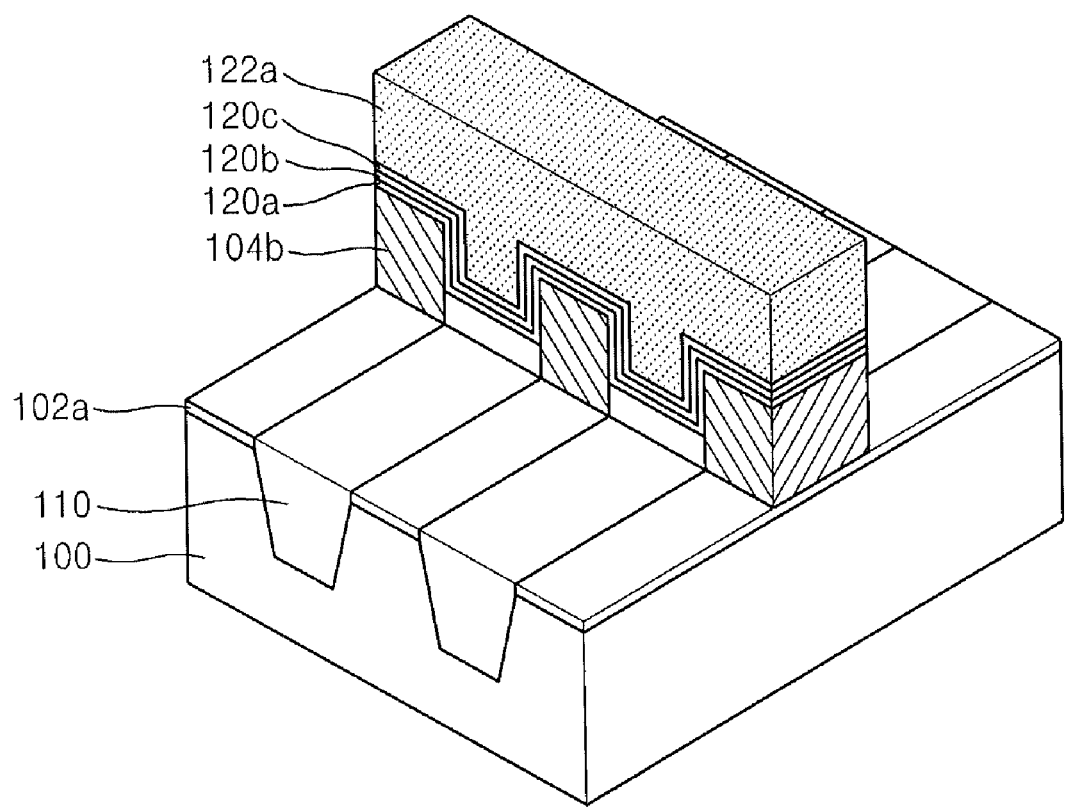

Referring to FIG. 15, a protruding portion of the insulating layer pattern 110 formed at the side of the floating gate pattern 104a may be removed. The protruding portion of the insulating layer pattern 110 may be removed according to an etching selectivity of the floating gate pattern 104a. Next, the floating gate pattern 104a may be etched to form a floating gate electrode 104b. Consequently, a gate structure in which the tunneling insulating layer pattern 102a, the floating gate electrode 104b, the lower dielectric layer 120a, the high-K layer 120b, the upper dielectric layer 120c, and the control gate pattern 122a are stacked is formed.

Although not illustrated in the drawings, an impurity area may be formed by injecting and/or implanting an impurity under the upper surface of the substrate 100 corresponding to two sides of the gate structure. Consequently, a cell of a non-volatile memory device may be completed.

Figure 16:
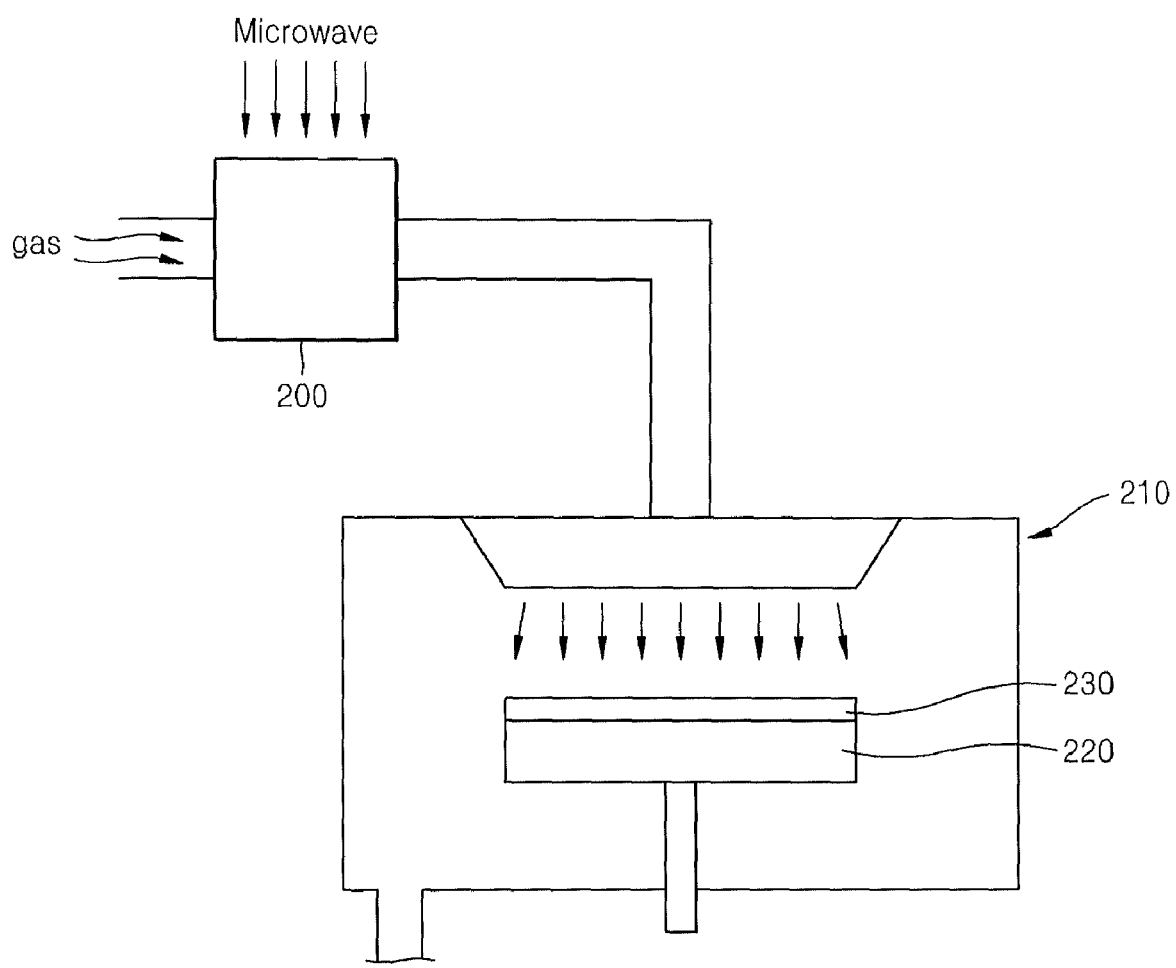
FIG. 16 is a schematic view illustrating a chamber including remote plasma that is used to isotropically etch an upper dielectric layer according to some embodiments of the present invention.

FIG. 16 is a schematic view illustrating a chamber 210 using remote plasma to isotropically etch an upper dielectric layer according to some embodiments of the inventive concept.

Referring to FIG. 16, oxygen ($O_2$) and fluorine-based gas are injected into a plasma generator 200. The fluorine-based gas may be as described above. For example, $CF_4$ may be injected as the fluorine-based gas. Oxygen ($O_2$) and $CF_4$ may be provided in a ratio in the range of about 1000:1 to 5000:1. Active fluorine (F) is generated by plasma dissolution in the plasma generator 200, and is injected into the chamber 210. The active fluorine injected into the chamber 210 reacts with a membrane (not shown) of a surface of a substrate 230 formed on a heating stage 220 and volatile reactants from the membrane are discharged. In detail, the membrane of the surface of the substrate 230 may be an upper dielectric layer, and the upper dielectric layer may be a silicon oxide layer. In this case, an exposed portion of the silicon oxide layer reacts with the active fluorine, thereby discharging $SiF_4$ and oxygen ($O_2$) as volatile reactants.

Selectively, as described with reference to the embodiment of FIGS. 7 through 15, the second photoresist pattern 126a, the second hard mask pattern 124a, and the upper dielectric layer 120c of FIG. 12 may be removed at the same time in a chamber including remote plasma. In this case, the membrane (not shown) on the surface of the substrate 230 refers to the second photoresist pattern 126a, the second hard mask pattern 124a, and the upper dielectric layer 120c of FIG. 12.

In the plasma generator 200, active oxygen (O) is generated from oxygen ($O_2$) by plasma dissolution and is injected into the chamber 210. The active oxygen injected into the chamber 210 reacts with the membrane including the second photoresist pattern 126a of FIG. 12 on the surface of the substrate 230 and volatile reactants from the membrane are discharged. That is, the active oxygen oxidizes a photoresist pattern, which is an organic material, and the oxidized organic materials are discharged in the form of volatile gas such as vapor ($H_2O$) or carbon dioxide ($CO_2$).

The second hard mask pattern 124a of FIG. 12 may be a silicon oxide, a silicon nitride, and/or a silicon oxide nitride. When the second hard mask pattern 124a of FIG. 12 is a silicon oxide, the silicon oxide and the active fluorine react, then $SiF_4$ and oxygen ($O_2$) are discharged as described above. When the second hard mask pattern 124a of FIG. 12 is a silicon nitride, the silicon nitride and the active fluorine react, and $SiF_4$ and nitrogen ($N_2$) are discharged. Accordingly, the second photoresist pattern 126a, the second hard mask pattern 124a, and the upper dielectric layer 120c of FIG. 12 may be removed at the same time without additional ashing process and/or strip process.

Elements illustrated in the drawings, which are provided for clear understanding of the inventive concept, should be regarded as illustrative only. It should be understood that the elements may be modified in various forms other than the illustrated ones.

While the embodiments of the present invention have been particularly shown and described with reference to examples of embodiments thereof, it will be understood that various changes in form and details may be made therein without departing from the spirit and scope of the following claims.

That which is claimed is:

1. A method of forming a semiconductor device, the method comprising:
    forming a first pattern on a substrate;
    forming a first dielectric layer on the first pattern, wherein the first pattern is between portions of the first dielectric layer and the substrate;
    forming a second dielectric layer on the first dielectric layer, wherein the first dielectric layer is between the first pattern and the second dielectric layer;
    forming a second pattern on the second dielectric layer, wherein portions of the second dielectric layer are exposed by the second pattern and wherein the first and second dielectric layers are between portions of the first and second patterns wherein forming the second pattern comprises,
        forming a conductive layer on the second dielectric layer wherein the second dielectric layer is between the conductive layer and the first pattern,
        forming a mask pattern on the conductive layer exposing portions of the conductive layer wherein the mask pattern comprises a hard mask pattern on the conductive layer and a photoresist mask pattern on the hard mask pattern, and
        anisotropically etching the exposed portions of the conductive layer using the mask pattern to provide a control gate pattern exposing portions of the second dielectric layer;
    isotropically etching the exposed portions of the second dielectric layer; and
    after isotropically etching the exposed portions of the second dielectric layer, removing the mask pattern by ashing the photoresist pattern and stripping the hard mask pattern.

2. The method according to claim 1 wherein isotropically etching the exposed portions of the second dielectric layer comprises isotropically etching the exposed portions of the second dielectric layer in a chamber different from a chamber used to form the second pattern.

3. The method according to claim 1,
    wherein forming the first pattern comprises,
        forming a tunneling insulating layer on the substrate, and
        forming a first conductive layer on the tunneling insulating layer, wherein the tunneling insulating layer is between the substrate and the first conductive layer, and
        patterning the tunneling insulating layer and the first conductive layer to provide a tunneling insulating layer pattern and a first conductive layer pattern of the first pattern, and
    wherein forming the second pattern comprises,
        forming a second conductive layer on the second dielectric layer, and
        patterning the second conductive layer to form a control gate pattern.

4. The method according to claim 1 wherein forming the first dielectric layer comprises,
    forming a first dielectric sub-layer on a surface of the first pattern opposite the substrate, and on sidewalls of the first pattern, and
    forming a second dielectric sub-layer comprising a high-k dielectric material on the first dielectric sub-layer, wherein the first dielectric sub-layer is between the first pattern and the second dielectric sub-layer and wherein the first and second dielectric sub-layers comprise different materials.

5. The method according to claim 4 wherein the second dielectric sub-layer comprises at least one selected from the group consisting of an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide (LaAlO), a lanthanum hafnium oxide (LaHfO), a hafnium aluminum oxide (HfAlO), and praseodymium oxide ($Pr_2O_3$).

6. The method according to claim 4 further comprising:
    after isotropically etching the exposed portions of the second dielectric layer, isotropically etching portions of the second dielectric sub-layer comprising the high-k dielectric material in a same chamber used when isotropically etching the exposed portions of the second dielectric layer.

7. The method according to claim 4 further comprising:
    after isotropically etching the exposed portions of the second dielectric layer, anisotropically etching portions of the second dielectric sub-layer comprising the high-k dielectric material using a chamber different than a chamber used when isotropically etching the exposed portions of the second dielectric layer.

8. The method according to claim 1 wherein isotropically etching the exposed portions of the second dielectric layer comprises isotropically etching the exposed portions of the second dielectric layer using remote plasma.

9. The method according to claim 1 wherein isotropically etching the exposed portions of the second dielectric layer comprises wet etching the exposed portions of the second dielectric layer.

10. A method of forming a semiconductor device, the method comprising:
    forming a tunneling insulating layer pattern and a floating gate pattern on a substrate, wherein the tunneling insulating layer pattern is between the floating gate pattern and the substrate;
    forming first, second, and third dielectric sub-layers on the floating gate pattern, wherein the second dielectric sub-layer comprises a high-k material between the first and third dielectric sub-layers;
    forming a conductive layer on the third dielectric sub-layer, wherein the first, second, and third dielectric sub-layers are between the conductive layer and the floating gate pattern;
    patterning the conductive layer in a chamber to form a control gate pattern exposing portions of the third dielectric sub-layer, wherein patterning the conductive layer comprises,
        forming a mask pattern on the conductive layer exposing portions of the conductive layer wherein the mask pattern comprises a hard mask pattern on the conductive layer and a photoresist mask pattern on the hard mask pattern, and
        anisotropically etching the exposed portions of the conductive layer using the mask pattern to provide the control gate pattern exposing portions of the third dielectric sub-layer;
    isotropically etching the exposed portions of the third dielectric sub-layer outside the chamber used to pattern the conductive layer; and
    after isotropically etching the exposed portions of the third dielectric sub-layer, removing the mask pattern by ashing the photoresist pattern and stripping the hard mask pattern.

11. The method of claim 10 further comprising:
    etching portions of the second dielectric sub-layer comprising the high-k material exposed after isotropically etching the exposed portions of the third dielectric sub-layer.

12. The method of claim 11 wherein the chamber comprises a first chamber, wherein etching the portions of the second dielectric sub-layer comprises etching the portions of the second dielectric sub-layer in a second chamber different than the first chamber, and wherein etching the portions of the second dielectric sub-layer comprises isotropically etching the portions of the second dielectric sub-layer in the second chamber.

13. The method of claim 11 wherein etching the portions of the second dielectric sub-layer comprising the high-k dielectric material comprises anisotropically etching the portions of the second dielectric sub-layer.

14. The method of claim 11 further comprising:
    after etching the portions of the second dielectric sub-layer, etching exposed portions of the first dielectric sub-layer and the floating gate pattern.

15. The method of claim 10 wherein the third dielectric sub-layer comprises a silicon oxide layer.

16. The method of claim 15, wherein the chamber comprises a first chamber, wherein isotropically etching the exposed portions of the third dielectric sub-layer comprises isotropically etching the portions of the silicon oxide layer using remote plasma in a second chamber different than the first chamber.

17. A method of forming a semiconductor device, the method comprising:
    forming a tunneling insulating layer on a substrate;
    forming a first conductive layer on the tunneling insulating layer wherein the tunneling insulating layer is between the first conductive layer and the substrate;
    patterning the tunneling insulating layer and the first conductive layer to provide a plurality of floating gate patterns on a respective plurality of tunneling insulating layer patterns;
    forming an insulating layer pattern on the substrate between adjacent floating gate patterns;
    forming a first silicon oxide layer on the insulating layer pattern, on sidewalls of the floating gate patterns, and on surfaces of the floating gate patterns opposite the substrate;
    forming a high-k dielectric layer on the first silicon oxide layer wherein the first silicon oxide layer is between the high-k dielectric layer and the floating gate patterns;
    forming a second silicon oxide layer on the high-k dielectric layer wherein the high-k dielectric layer is between the first and second silicon oxide layers;
    forming a second conductive layer on the second silicon oxide layer wherein the second silicon oxide layer is between the second conductive layer and the floating gate patterns;
    forming a mask pattern on the second conductive layer exposing portions of the second conductive layer wherein the mask pattern comprises a hard mask pattern on the second conductive layer and a photoresist mask pattern on the hard mask pattern;
    anisotropically etching the exposed portions of the second conductive layer using the mask pattern to provide a control gate pattern exposing portions of the second silicon oxide layer;
    isotropically etching the exposed portions of the second silicon oxide layer using remote plasma; and
    after isotropically etching the exposed portions of the second silicon oxide layer, removing the mask pattern by ashing the photoresist pattern and stripping the hard mask pattern.

18. The method of claim 17 wherein isotropically etching the exposed portions of the second silicon oxide layer comprises isotropically etching the exposed portions of the second silicon oxide layer using the remote plasma in a chamber, and wherein removing the mask pattern comprises ashing the photoresist pattern and stripping the hard mask pattern in the chamber using remote plasma.

* * * * *